(12) United States Patent  
Porter

(10) Patent No.: US 8,089,800 B2
(45) Date of Patent: Jan. 3, 2012

(54) MEMORY CELL

(75) Inventor: John D. Porter, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/902,830

(22) Filed: Oct. 12, 2010

(65) Prior Publication Data

US 2011/0026304 A1 Feb. 3, 2011

Related U.S. Application Data

(62) Division of application No. 12/053,236, filed on Mar. 21, 2008, now Pat. No. 7,813,167.

(51) Int. Cl.
*G11C 11/00* (2006.01)

(52) U.S. Cl. ............... 365/148; 365/163; 365/189.09

(58) Field of Classification Search .............. 365/148, 365/163, 189.09
See application file for complete search history.

(56) References Cited

U.S. PATENT DOCUMENTS

| | | | |
|---|---|---|---|
| 5,796,667 A | 8/1998 | Sweha et al. | |
| 6,737,312 B2 | 5/2004 | Moore | |
| 6,813,177 B2 | 11/2004 | Lowrey et al. | |
| 7,102,150 B2 | 9/2006 | Harshfield et al. | |
| 7,151,688 B2 | 12/2006 | Williford et al. | |
| 7,190,608 B2 | 3/2007 | Williford et al. | |
| 7,233,054 B1 | 6/2007 | Anh et al. | |
| 7,242,174 B1 | 7/2007 | Shen et al. | |
| 7,242,603 B2 | 7/2007 | Hush et al. | |
| 7,864,565 B2 * | 1/2011 | Nirschl et al. | 365/163 |
| 2007/0041259 A1 | 2/2007 | Terzioglu et al. | |
| 2007/0147102 A1 | 6/2007 | Roehr | |
| 2007/0279962 A1 * | 12/2007 | Nirschl et al. | 365/148 |

OTHER PUBLICATIONS

Hudgens, S., et al., "Overview of Phase-Change Chalcogenide Nonvolatile Memory Technology", MRS Bulletin, pp. 829-832, Nov. 2004.

www.firescope.com, "Real-Time IT Dashboards", Technology +News Daily, http:/www.technologynewsdaily.com/node/5454, Dec. 12, 2006 (3 pgs.).

* cited by examiner

*Primary Examiner* — Huan Hoang
(74) *Attorney, Agent, or Firm* — Brooks, Cameron & Huebsch, PLLC

(57) ABSTRACT

Methods, and circuits, are disclosed for operating a programmable memory device. One method embodiment includes storing a value as a state in a first memory cell and as a complementary state in a second memory cell. Such a method further includes determining the state of the first memory cell using a first self-biased sensing circuit and the complementary state of the second memory cell using a second self-biased sensing circuit, and comparing in a differential manner an indication of the state of the first memory cell to a reference indication of the complementary state of the second memory cell to determine the value.

19 Claims, 10 Drawing Sheets

MEMORY CELL

CROSS-REFERENCE TO RELATED APPLICATIONS

This application is a Divisional of U.S. patent application Ser. No. 12/053,236 filed Mar. 21, 2008, now U.S. Pat. No. 7,813,167 issued Oct. 12, 2010, the specification of which is incorporated by reference herein.

TECHNICAL FIELD

The invention relates to semiconductors and semiconductor memory devices. More particularly, in one or more embodiments the invention relates to sensing programmable resistance memory cells used as fuses in memory devices.

BACKGROUND

Memory devices are typically provided as internal, semiconductor, integrated circuits in a wide range of processing applications, such as computers or other electronic devices. There are many different types of memory devices including random-access memory (RAM), read only memory (ROM), dynamic random access memory (DRAM), synchronous dynamic random access memory (SDRAM), flash memory, "phase-change" random access memory (PCRAM), and resistance random access memory (RRAM), among others. Memory devices can be comprised of an array arrangement of memory cells.

A memory cell stores digital information in a structure that can be rapidly switched between more than one readily discernable state. Some memory cells are based on the presence or absence of electrical charge contained in a region of the cell. By retaining its charge, the memory cell retains its stored data. Some memory cell structures inherently leak charge, and must be continually powered to refresh the stored charge.

Non-volatile memory however, does not require electrical power to retain charge information. For example, flash memory typically has a "floating leakage. Thus, power is required only to change the stored information, e.g., write-to (store charge), read-from (determine if charge is present), or erase (remove charge) data. The non-volatility of stored data in flash memory is advantageous in portable electronic applications. Uses for non-volatile memory include personal computers, personal digital assistants (PDAs), digital cameras, and cellular telephones. Program code and system data, such as a basic input/output system (BIOS) used in personal computer systems (among others), are typically stored in non-volatile memory devices.

"Phase change," memory cells use detectable changes in physical structure of the memory cell material to define various states, e.g., resistance changes associated with different molecular structures of the memory cell material. The various states can be associated with digital information. The physical layout of a PCRAM or RRAM memory cell within a memory device array may be arranged similarly to a DRAM memory cell; however, the capacitor of the DRAM cell is replaced by a material having detectable "phase change" characteristics, e.g., resistance states.

Memory cells in an array architecture can be programmed to a desired resistance state. A single "phase change" memory cell may have more than two discernable "phase" states, each "phase" state having a corresponding different resistance state, and thus may store more than two data values, e.g., digits. Such memory cells may be referred to as multi state memory cells, multidigit cells, or multilevel cells (MLCs). MLCs can allow the manufacture of higher density memories without increasing the number of memory cells since each cell can represent more than one binary digit, e.g., more than one bit. MLCs having more than one programmed state, e.g., a memory cell capable of representing two digits can have four programmed states, a cell capable of representing three digits can have eight program states, etc.

DETAILED DESCRIPTION

The present disclosure includes methods, and circuits, for operating a programmable memory device. One method embodiment includes storing a value as a state in a first memory cell and as a complementary state in a second memory cell. Such a method further includes determining the state of the first memory cell using a first self-biased sensing circuit and the complementary state of the second memory cell using a second self-biased sensing circuit, and comparing in a differential manner an indication of the state of the first memory cell to a reference indication of the complementary state of the second memory cell to determine the value.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
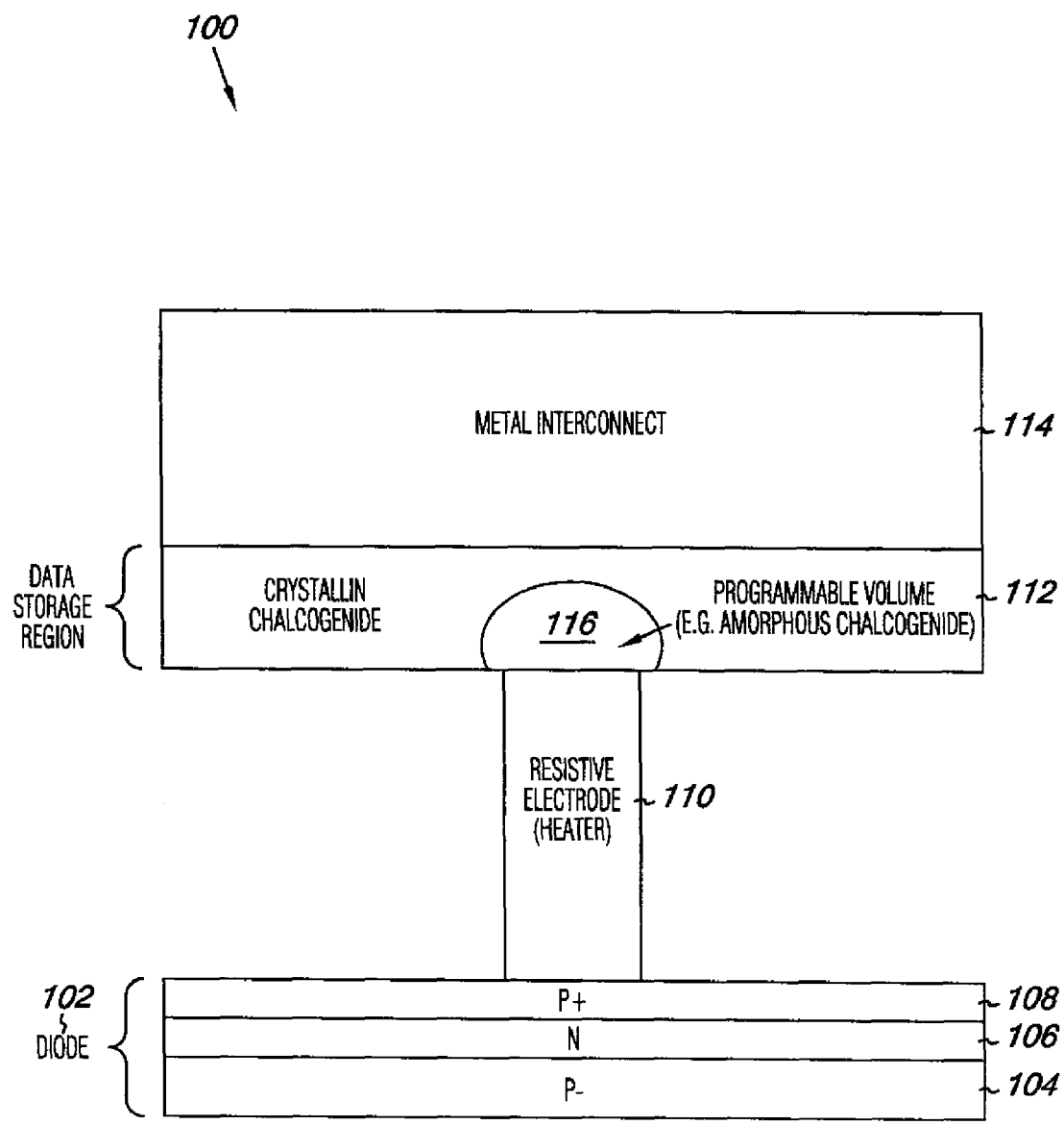
FIG. 1 is a diagram illustrating a prior art example "phase change" memory cell structure.

FIG. 1 is a diagram illustrating a prior art example of a "phase change" memory cell structure. One skilled in the relevant art will recognize the "phase change" memory cell shown in FIG. 1 as being a diode access cell using a vertical resistive electrode for beating a chalcogenide programmable volume.

Memory cell 100 includes a diode 102, formed by the junctions between the p– layer 104, n layer 106, and p+ layer 108. Formed atop the diode 102 is a resistive electrode 110, across which heat is generated by current flow therethrough. A chalcogenide material layer 112 is formed between the resistive electrode 110 and a metal interconnect layer 114.

Current passing through the diode 102, through the resistive electrode 110, and to the metal interconnect 114, causes the resistive electrode 110 to generate sufficient heat to change the "phase" of a portion of the chalcogenide 112 from a crystalline "phase" to an amorphous "phase." The portion of the chalcogenide 112 which incurs the "phase change" is known as the programmable volume 116. The crystalline "phase" of the chalcogenide 112 has different electrical resistance characteristics than the amorphous "phase." Thus, the programmable volume 116 has different resistance states corresponding to different proportions of crystalline and amorphous "phases" into which the material is programmed.

One skilled in the art will appreciate that a memory cell may alternatively be fabricated using a lateral structure, and may include a complementary metal oxide semiconductor (CMOS) transistor, or other type transistor, access device. Operation of such a "phase change" device is similar to the memory cell 100 shown in FIG. 1, in that current flow causes the "phase change" material to change states, e.g., from a more crystalline chalcogenide to a more amorphous chalcogenide.

Figure 2:
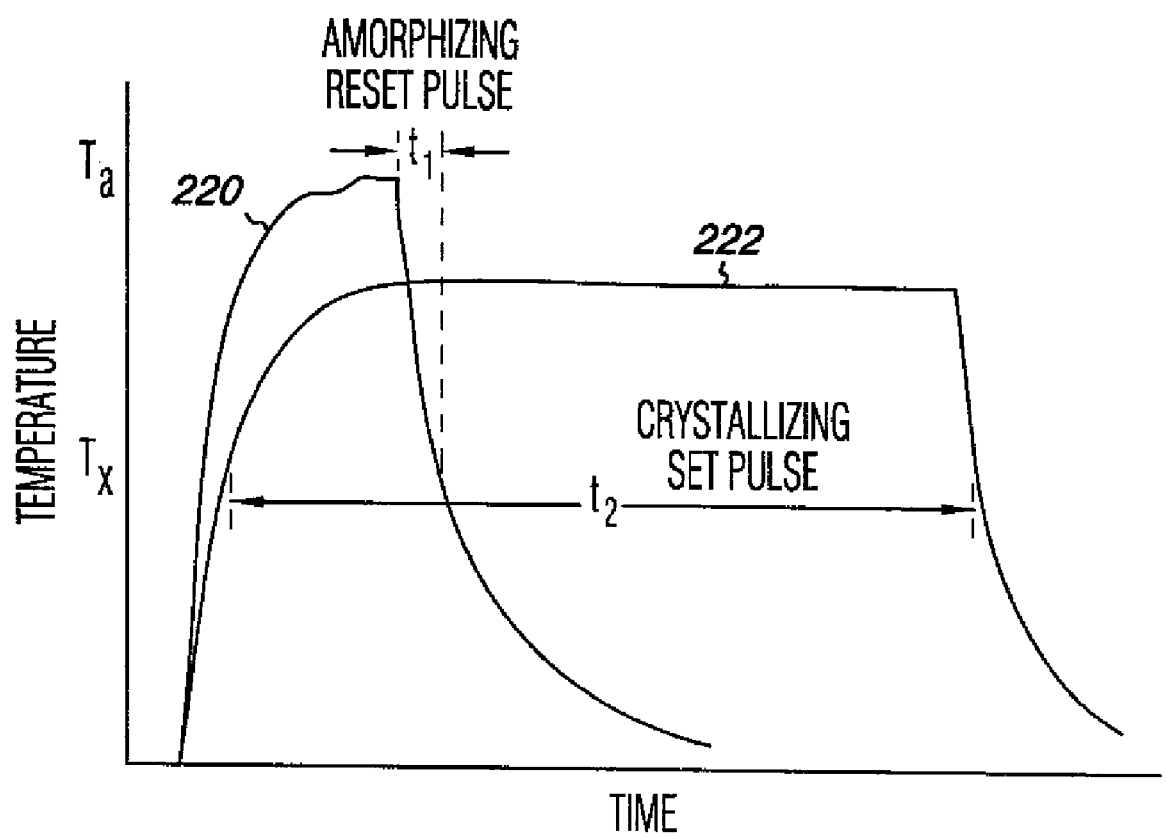
FIG. 2 illustrates a temperature-time relationship during programming for a prior art "phase change" rewritable memory cell.

FIG. 2 illustrates a temperature time relationship during programming for a prior art "phase change" rewritable memory cell. "Phase change" materials, e.g., Germanium-Antimony-Telluride (GST) or other chalcogenide materials, can be used to create variable resistance memory devices. Chalcogenide materials can include compounds of sulfides, sclenides, and tellurides, among others. A "phase change" material can include a number of Germanium-Antimony-Tellurium materials, e.g., Ge—Sb—Te such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements.

Other "phase change" materials can include GeTe, In—Se, $Sb_2Te_3$, GaSb, InSb, As—Te, and Al—Te. Additional "phase change" materials can include Te—Ge—As, In—Sb—Te, Te—Sn—Se, Ge—Se—Ga, Bi—Se—Sb, Ga—Se—Te, Sn—Sb—Te, and In—Sb—Ge. Some "phase change" memories may include a "phase change" material such as Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Ge—Sb—Se—Te, Ge—Sn—Sb—Te, Ge—Te—Sn—Pd, and Ge—Te—Sn—Pt, among others. Embodiments of the present invention are not limited to the above-listed mixtures and compounds, and may include impurities and the addition of other elements as well.

As shown in FIG. 1, a diode, metal oxide semiconductor field effect transistor (MOSFET), or bipolar junction transistor (BJT), can be connected in series with the "phase change" material as an access device. Embodiments of the present invention are not limited to the above-mentioned type switching devices, and may employ any suitable controllable switch technology as an access device.

The storage mechanism of the "phase change" material is the controllable amorphous-crystalline structural changes which can be made to occur in the material. Accompanying the structural changes to the materials are observable characteristic changes. For example, the resistance of the material changes as the structure of the material changes between crystalline and amorphous structure. Generally, the changes to the amorphous-crystalline structure of material is referred to as a "phase change"; however, embodiments of the present invention are not so limited. For example, resistance changes to a material used in accordance with embodiments of the present invention may be controlled by affecting other properties of the material, e.g., without changing the molecular organization, or "phase," of the material, such as processing to change conductivity of a material mixture by rearranging structures of one or more constituents of the mixture, causing chemical reactions involving the mixture constituents, causing micro or macro separation of certain mixture constituents, among others.

The materials are known as "phase change" materials because glassy materials are produced by rapidly super cooling a liquid below its melting point to a temperature at which atomic motion necessary for crystallization cannot readily occur. Chalcogenide alloys are typically good glass-formers. In order to crystallize as amorphous region of a chalcogenide material, the material can be heated to a temperature somewhat below the melting point and held at this temperature for a time sufficient to allow crystallization to occur.

When a programmable volume in the crystalline state, the material acts like a linear resister, with a resistance of approximately 5 K-ohms or less according to one embodiment. When the programmable volume is in the amorphous state, a "phase change" memory cell has a characteristic threshold voltage, around 0.8V according to one embodiment. When a voltage below the threshold is applied to the programmed resistive material, the resistance is extremely high, e.g., 50 K-ohms or more. The reader will appreciate that in certain embodiments, there may only be a factor of 10, i.e., one or more order of magnitude, difference between the resistance values of the binary states. When a voltage above the threshold is applied to the programmed resistive material, the resistance is similar to the value in the crystalline state.

A single level cell (SLC) can be programmed to a generally more amorphous (reset) state or a generally more crystalline (set) state. Such reset and/or set states may be taken to correspond to a binary 0 and/or 1 for SIX devices. A reset pulse can include a relatively high current pulse applied to the cell for a relatively short period of time. The current applied, to the cell can be quickly reduced after the "phase change" material "melts" allowing it to cool quickly into a more amorphous state where atomic motion that can allow crystallization generally occurs to a lesser degree due, at least in part, to relatively rapid cooling of the material. Conversely, a set pulse can include a relatively lower current pulse applied to the cell for a relatively longer period of time with a slower quenching speed, e.g., the current may be more slowly reduced allowing, the "phase change" material greater time to cool. Accordingly, the material may crystallize to a greater degree than after the reset pulse. Thus, the "phase change" materials can be made to have a greater resistivity associated with a more amorphous state and a lesser resistivity associated with a more crystalline state.

FIG. 2 shows one example of an amorphizing (reset) pulse 220 over time t1, and a crystallizing (set) pulse 222 over time t2. The example embodiment of the amorphizing (reset) pulse 220 involves raising the temperature of the programmable volume, to a temperature Ta (to scramble some portion of internal crystalline structures) and rapidly cooling the programmable volume over a short time period, i.e., t1, such that the programmable volume cannot re-form some portion of the internal crystalline structures. The example embodiment of the crystallizing (set) pulse 222 shown in FIG. 2 involves raising the temperature of the programmable volume above a temperature Tx and keeping it there for a sufficient period of time, i.e., t2, such that the structure of the programmable volume has time to organize into the crystalline structure.

Figure 3:
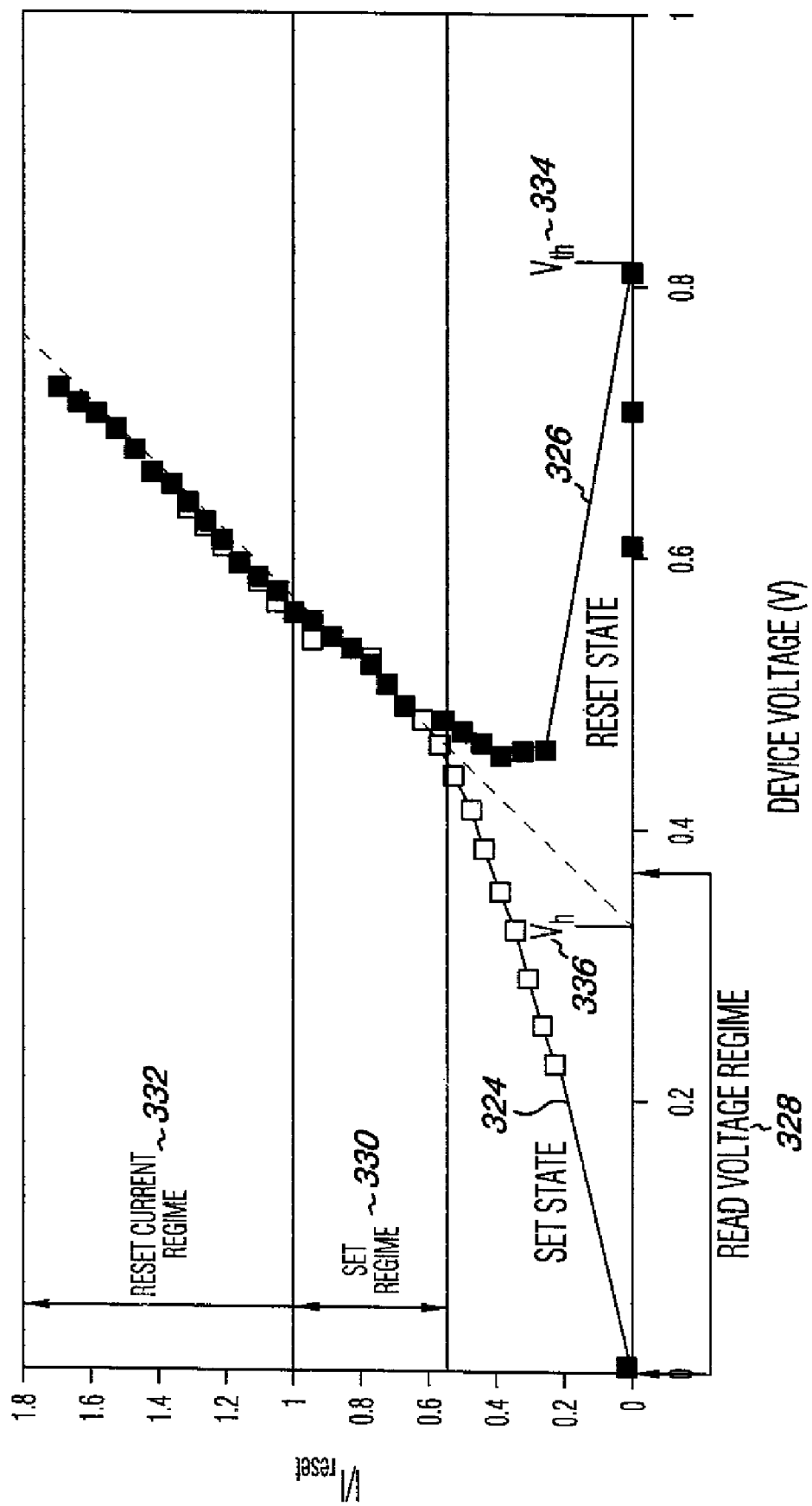
FIG. 3 illustrates current-voltage characteristics for a prior art "phase change" rewritable memory cell in both the amorphous ("high resistance"), and crystalline ("low resistance") states.

FIG. 3 illustrates current-voltage characteristics for a prior art "phase change" rewritable memory cell in both the amorphous ("high resistance"), and crystalline ("low resistance") states. The current-voltage characteristics are shown for "phase change" material being in a crystalline (set) state 324, and for "phase change" material being in an amorphous (reset) state 326. As shown in FIG. 3, the "phase change" material exhibits different resistive properties at low applied voltages (as indicated by the associated currents). These different resistive characteristics can be exploited at low voltages to ascertain which phase the programmable volume is in at any given time. Note that the current is near zero for programmable volumes in the amorphous (reset) state 326 until device voltages reach a threshold value, Vth 334.

A road voltage regime 328 can be established for a given chalcogenide at lower device voltages. Applying voltage and measuring current, or applying current and measuring voltage in this region indicates whether the programmable volume is in an amorphous (reset) state or a crystalline (set) state. In this manner, the programmable volume is read for the binary information contained by the resistance state in which it is presently in. In this manner, a bias current may be applied to the memory cell having a "phase change" element, with the resulting voltage being examined to determine whether the memory cell is in an amorphous state corresponding to one resistance state associated with one binary value, or a crystalline state corresponding to another resistance state associated with another binary value.

The resistive characteristics of the two material phases shown in FIG. 3, e.g., crystalline (set) state 324 and amorphous (reset) state 326, effectively coincide within a set current regime 330, and with an associated reset current regime 332, as shown in FIG. 3.

"Phase change" memory uses programmable elements (which are referred to hereinafter as "fuses") for redundancy and adjusting, e.g., trimming, setting, programming, etc., of reference voltages, reference current and/or timing. When in the amorphous state, a "phase change" memory cell has a characteristic threshold voltage, e.g., Vth 334. When in the crystalline state, a "phase change" memory cell acts similar to a linear resistor. As described above, during a road, a current is applied to the memory cell and a voltage is generated across the memory cell.

For a memory cell in a high resistance state, programming to a low resistance state needs a voltage pulse exceeding Vth, which supplies sufficient dynamic ON-state current to achieve the temperature necessary for crystallization. Programming a low resistance memory cell into a high resistance needs only sufficient current to melt the chalcogenide, with a quench back to the amorphous state. In read mode, verifying the cell resistance is accomplished at a voltage less than Vth, typically up to ~0.4 V, which results in a current less than the minimum to achieve the low resistance state programming. Verification can be done by supplying a voltage and sensing current, or by supplying a read (bias) current and measuring the voltage.

Care should be exercised when reading a "phase change" memory cell so that the contents are not corrupted during the read, e.g., too much current can generate heat to cause an inadvertent "phase change." The maximum voltage allowed across the memory cell during a read can be substantially lower than the threshold voltage Vth of the "phase change" material, or data corruption could occur. Limiting the maximum voltage allowed across a memory cell is discussed further below.

The physical layout of a "phase change" memory device, e.g., PCRAM, may resemble that of a DRAM memory device where the capacitor of the DRAM cell is replaced by a structure of "phase change" material, Germanium-Antimony-Telluride (GST) or other chalcogenide materials. An access device, such as a diode, metal oxide semiconductor field effect transistor (MOSFET), or bipolar junction transistor (BJT) can be connected in series with the "phase change" material in a manner that permits selection of individual memory cells for operation thereof.

The physical layout of a resistive RAM (RRAM) device may have memory cells including a variable resistor thin film, e.g., a colossal magnetoresistive material. The thin film can be connected to access devices such as diodes, field effect transistors (FETs), BJTs, or other electronic switching devices.

Figure 4A:
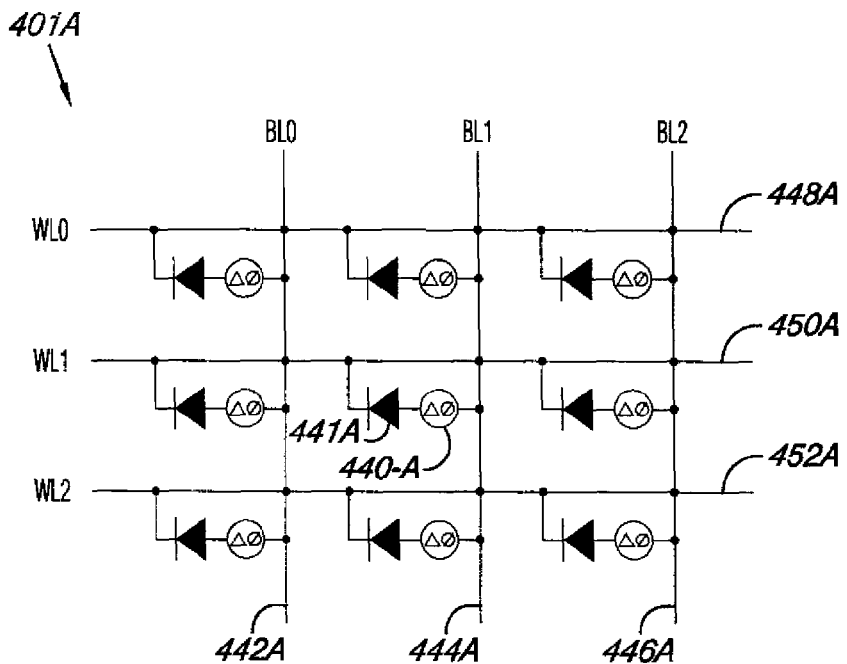
FIG. 4A illustrates a portion of a schematic of a memory array including diode access devices for a "phase change" rewritable memory cell in accordance with one or more embodiments of the present disclosure.

FIG. 4A illustrates a portion of a schematic of a memory array including diode access devices for a phase-change rewritable memory cell in accordance with one or more embodiments of the present disclosure. The memory array portion 401 includes a number of "phase change" memory elements 440 (indicated with a delta phase symbol), each having a resistance that varies with "phase" of the programmable resistance material, e.g., a "phase change" element or a variable resistance or switchable-resistive element. Each memory element 440A is coupled to a sense line, e.g., 442A (BL0), 444A (BL1), 446A (BL2), and to a select line, e.g., 448A (WL0), 450A (WL1), 452A (WL2), by an access diode 441A.

As one skilled in the art will appreciate, to access a particular memory cell, a corresponding select line, e.g., WL1, can be biased at a first voltage, e.g., 0V, while surrounding select lines, e.g., WL0 and WL2, are biased at a second voltage, e.g., 3V. A sense line, e.g., BL1, corresponding to the particular memory cell can then be biased at a first voltage, e.g., 1V, while surrounding sense lines, e.g., BL0 and BL2, can be biased at a second voltage, e.g., 0V. In this manner, individual memory cells may be accessed through their corresponding access device, e.g., diode 441A, to enable sensing of the memory cell, among other functions.

Figure 4B:
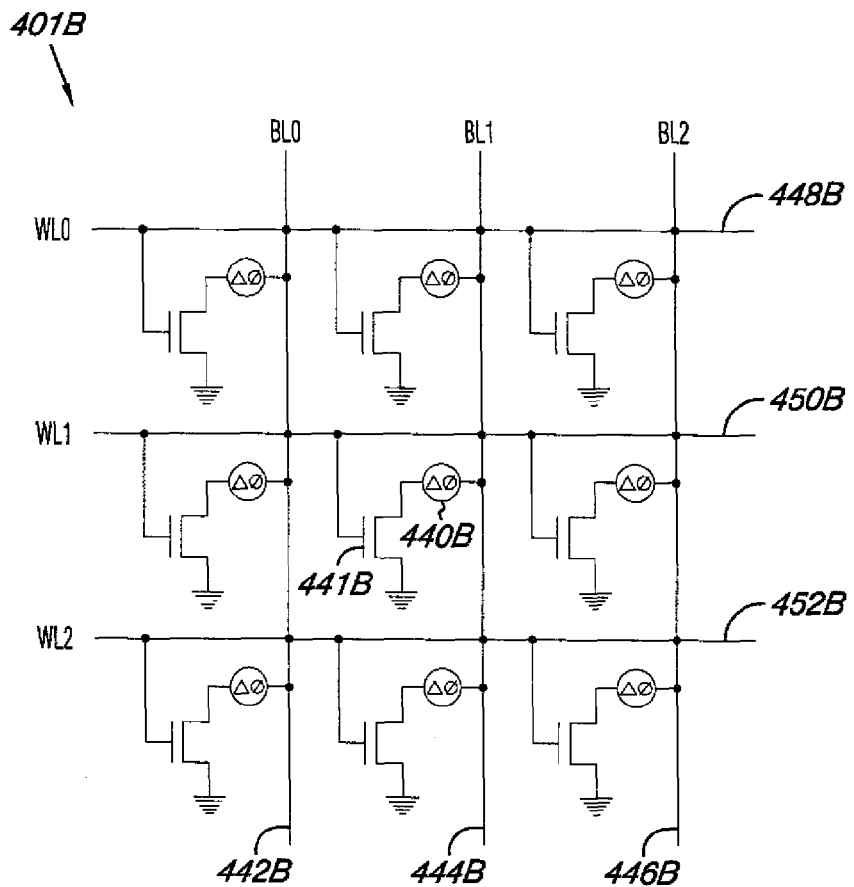
FIG. 4B illustrates a portion of a schematic of a memory array including metal oxide semiconductor field effect transistor (MOSFET) access devices for a "phase change" rewritable memory cell in accordance with one or more embodiments of the present disclosure.

FIG. 4B illustrates a portion of a schematic of a memory array including metal oxide semiconductor field effect transistor (MOSFET) access devices for a phase-change rewritable memory cell in accordance with one or more embodiments of the present disclosure. The memory array portion 401B includes a number of "phase change" (with corresponding variable resistance characteristics) memory elements 440B, e.g., a "phase change" element or a resistive switching element. Each memory element 440B is coupled to a sense, e.g., bit, line, e.g., 442B (BL0), 44413 (BL1), 44613 (BL2), and to a select, e.g., word, line, e.g., 448B (WL0), 450B (WL1), 452B (WL2), by a transistor access device 441B, e.g., a metal oxide semiconductor field effect transistor (MOSFET).

As one skilled in the art will appreciate, to access a particular memory cell, a corresponding select line, e.g., WL1, can be biased at a first voltage, e.g., 1.8V, while surrounding select lines, e.g., WL0 and WL2, are biased at a second voltage, 0V. A sense line, e.g., BL1, corresponding to the particular memory cell can then be biased at a first voltage, e.g., 0.3V, while surrounding sense lines, e.g., BL0 and BL2, can be biased at a second voltage, e.g., 0V. In this manner, individual memory cells may be accessed through their corresponding access device, e.g., MOSFET 441B, to enable sensing of the memory cell, among other functions.

Figure 4C:
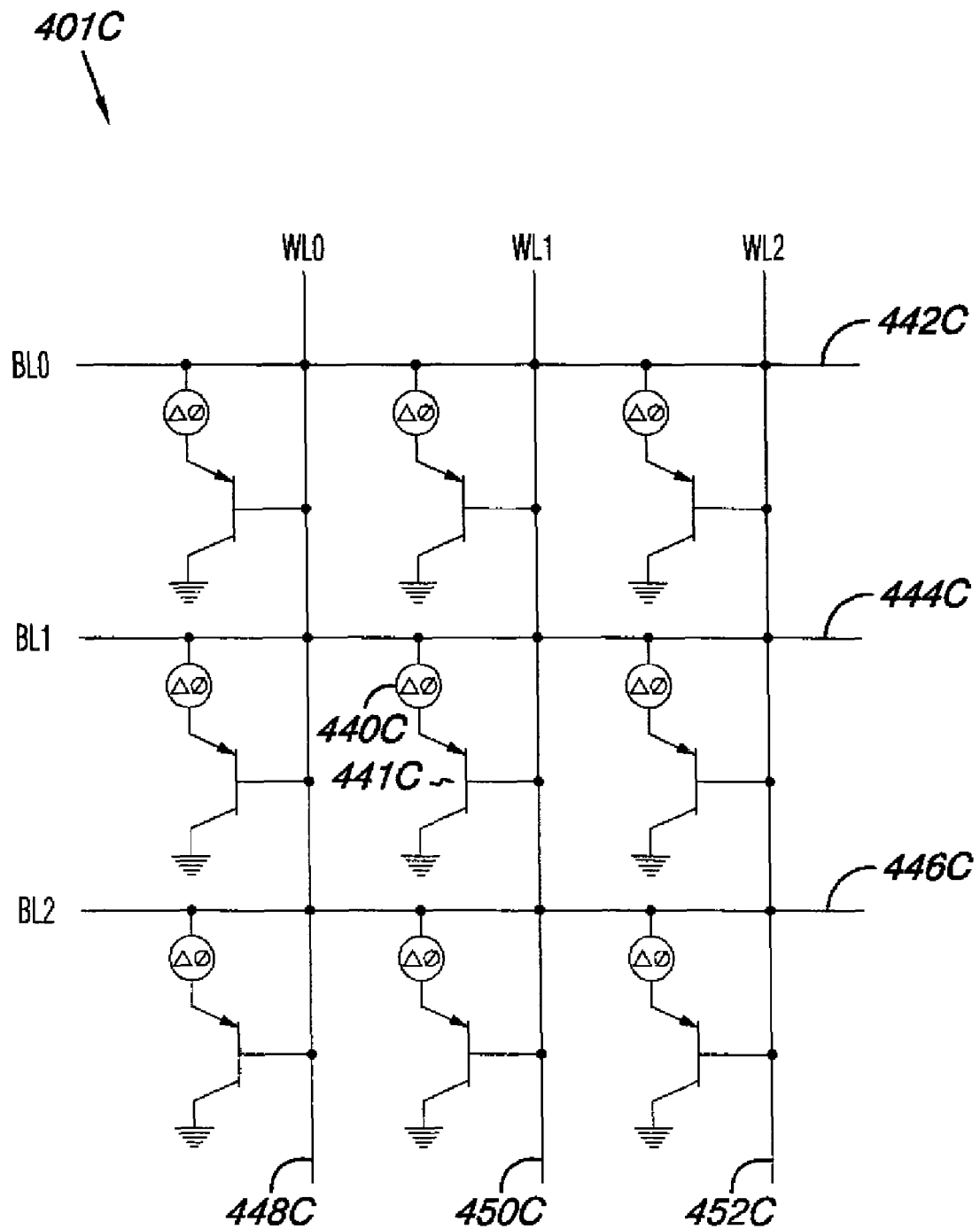
FIG. 4C illustrates a portion of a schematic of a memory array including bipolar junction transistor (BJT) access devices for a "phase change" rewritable memory cell in accordance with one or more embodiments of the present disclosure.

FIG. 4C illustrates a portion of a schematic of a memory array including bipolar junction transistor (BJT) access devices for a "phase change" rewritable memory cell in accordance with one or more embodiments of the present disclosure. The memory array portion 401C includes a number of "phase change" memory elements 440C, e.g., a "phase change" element or a switchable resistance or variable resistive element. Each resistance variable memory element is coupled to a sense line, e.g., 442C (BL0), 444C (BL1), 446C (BL2), and to a select line, e.g., 448C (WL0), 450C (WL1), 452C (WL2), by an access transistor, e.g., a bipolar junction transistor (BJT). Note that the orientations of the sense and select lines are shown reversed in FIG. 4C from those shown in FIGS. 4A and 4B. However, accessing a particular individual memory cell is accomplished in a similar manner as described above for the diode array illustrated in FIG. 4A.

Figure 4D:
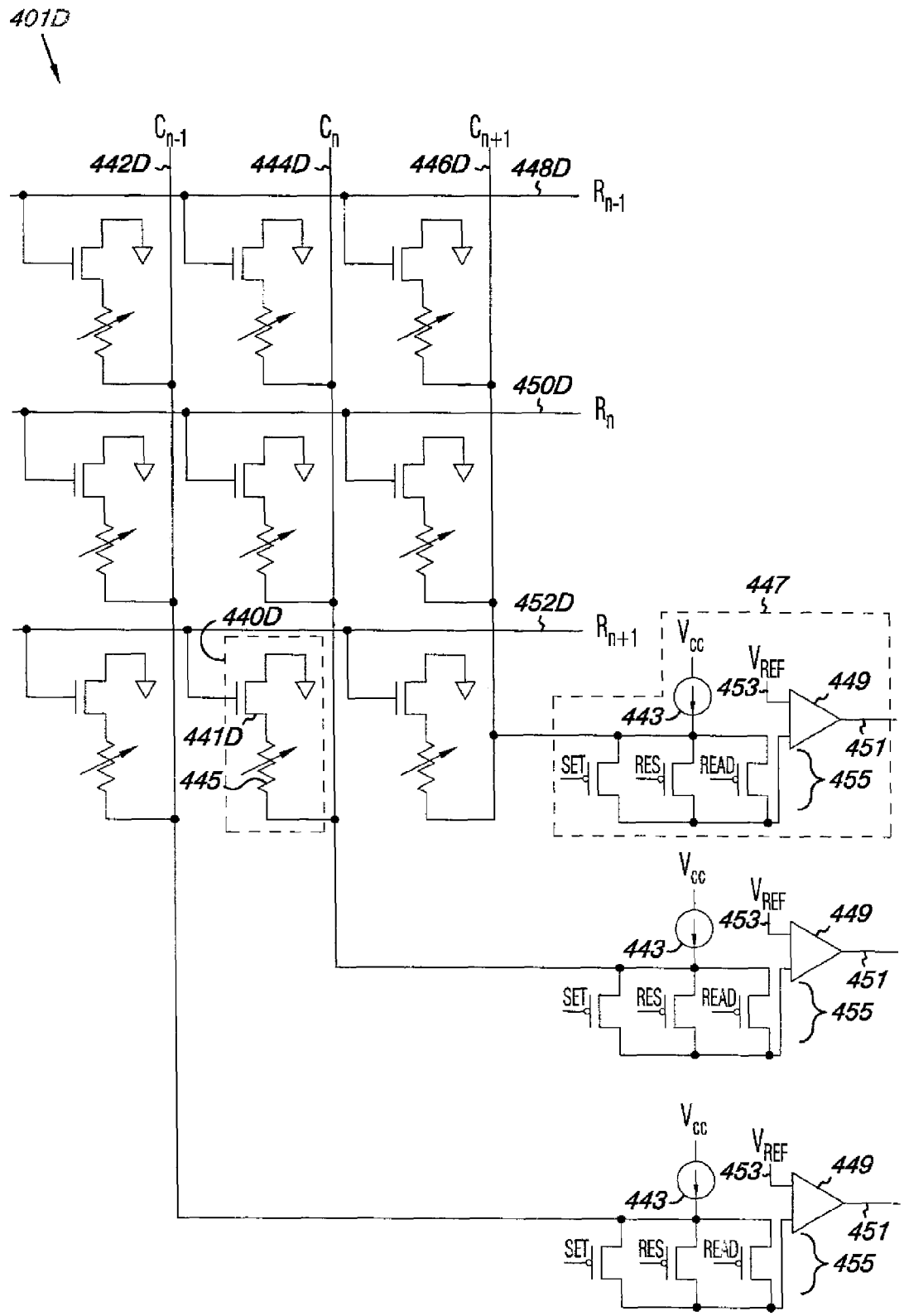
FIG. 4D illustrates a portion of a schematic of a memory array having variable, e.g., programmable, resistance elements, and sensing circuitry.

FIG. 4D illustrates a portion of a schematic of a memory array having variable, e.g., programmable, resistance elements, and sensing-circuitry. The memory array portion 401D includes a number of "phase change" memory elements 440D (with corresponding variable resistance characteristics). Each memory element 440D includes a transistor access device 441D, e.g., a MOSFET, coupled in series with a variable resistance 445, such as a programmable volume of "phase change" material having associated resistance states which vary with phase constituency. One terminal of the transistor access device 441D is connected to ground, and thus provides a switchable path to ground for controlling current flow through the variable resistance 445.

The gate of the transistor access device 441D is coupled to a sense line, e.g., 442D (Cn−1), 444D (Cn), 446D (Cn+1), and one terminal of the variable resistance 445 is coupled to a select line, e.g., 448D (Rn−1), 450D (Rn), 452D (Rn+1). Accessing individual memory cells is accomplished in the same manner through the MOSFET transistor, as was described above with respect to FIG. 4B. Select lines correspond to rows of the array shown in FIG. 4D, also referred to as word lines in some embodiments. Sense lines correspond to columns of the array shown in FIG. 4D, also referred to as bit lines in some embodiments.

A sense circuit, e.g., 447, is coupled to each respective sense line, e.g., 442D (Cn−1), 444D (Cn), and 446D (Cn+1). The sense circuit 447 supplies sense current, for example from a current source 443, to a memory element 440D, and compares the sense line voltage (typically) to a reference voltage 453 through amplifier 449 to produce an output 451. Sense line current is sunk through one of a number of control transistors 455, depending on type of operation, e.g., set, reset, or read.

Although a number of access devices and example operating parameters for programmable resistance memory coils have been illustrated and described in connection with FIGS. 4A-4D, embodiments of the present disclosure are not so limited. Other types and arrangements of access devices, memory array architectures, and operating parameters are contemplated in one or more embodiments of the present invention, as will be understood by one of ordinary skill in the art.

One skilled in the art will appreciate that the sense circuit 447 needs an accurate reference voltage 453 signal to perform accurate sensing of memory cells, e.g., the voltage developed as a result of a bias current being passed through a programmable resistance is compared to the reference voltage corresponding to a particular digital value. As mentioned, memory, such as "phase change" memory, uses fuses not only for redundancy, but also for adjusting the values of reference voltages. According to one technique, information related to the generation of such reference voltage signals may be stored in a portion of the memory. However, if a reference voltage is required to read the information stored in memory, which in turn is needed to accurately adjust the reference voltage, then a "chicken and egg," or circular, problem arises. If errors occur in the reference voltage, subsequent errors in the interrogation of the other memory cells may follow.

Some portion of the memory cells of a memory device may be used as fuses. For example, "phase change" memory with its variable resistance can be appropriately programmed to vary resistance in a circuit so as to adjust circuit response as a means of adjusting certain signals associated with the memory, including for example, reference voltage magnitudes.

As discussed above with respect to FIG. 3, care should be exercised when reading a "phase change" memory cell so that the contents are not corrupted during the read, such as confining the read voltage applied to a programmable resistance memory cell to the read voltage region illustrated in FIG. 3. During the reading of a memory cell, the cell should be biased at a voltage well below the threshold voltage (Vth, or further abbreviated as Vt) of the "phase change" material to avoid changing the state of the material. One method to limit the maximum voltage allowed across a memory cell is by clamping the maximum voltage across the "phase change" memory cell to a particular maximum value within a desired read range.

Figure 5:
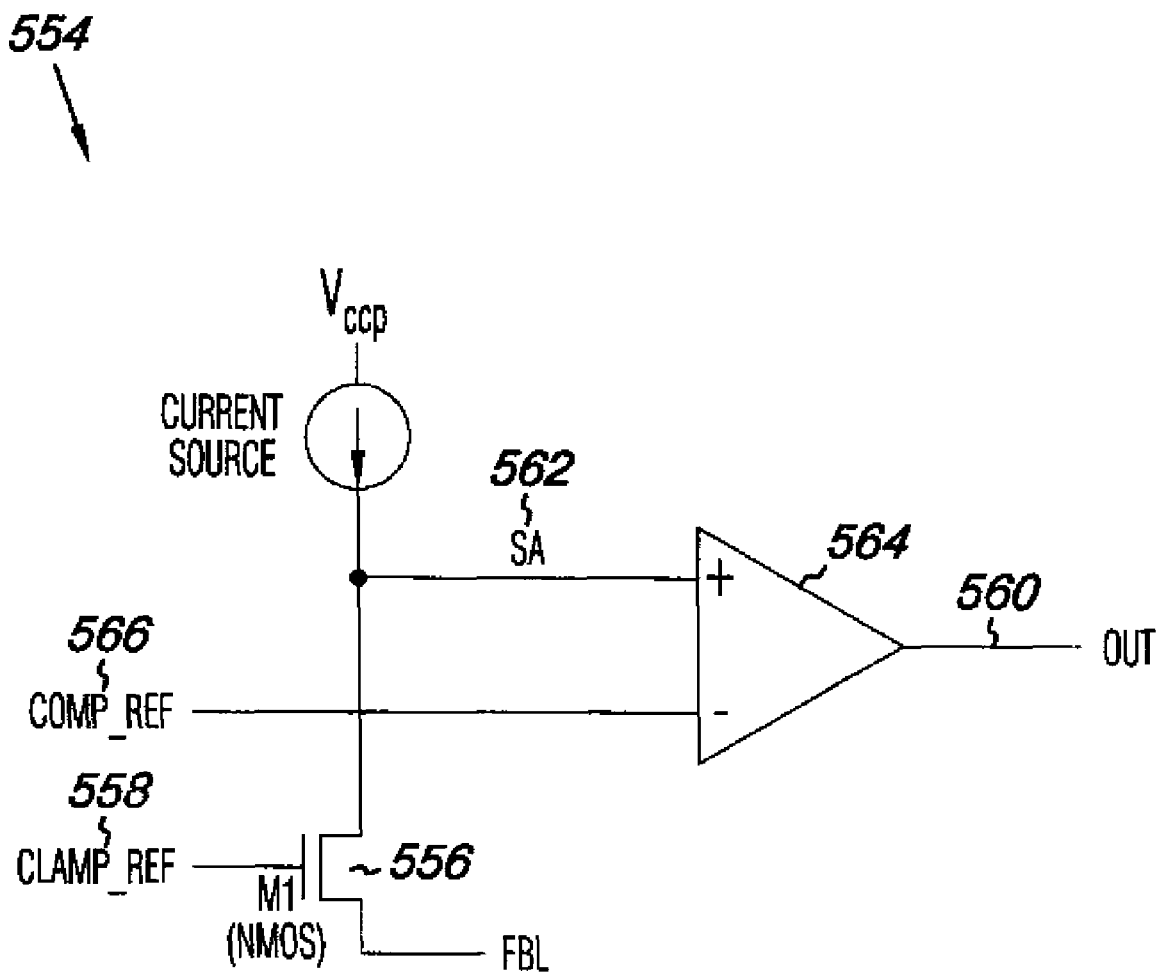
FIG. 5 illustrates a schematic of a prior art sensing amplifier circuit.

FIG. 5 illustrates a schematic of a prior art sensing amplifier circuit. Sensing circuit 554 limits the voltage applied to the memory cell via the fuse bit line (FBL) signal voltage is limited by passing the current through the drain of an NMOS transistor 556, with a first reference voltage 558 (CLAMP_REF) applied to its gate. Transistor 556 is the voltage limiter for the fuse output 560, with the non-inverting input 562 of amplifier 564 being fixed at one junction drop above the voltage of the MIL signal. Voltage CLAMP_REF 558, i.e., clamp reference, is a reference voltage. The reader can appreciate the problem if information from the fuse being read is needed to generate the CLAMP_REF 558 signal.

A compare reference voltage, e.g., into the inverting terminal of the comparator 564, is set to be the desired voltage boundary between the amorphous and crystalline states of the programmable volume of the "phase change" material. The compare reference voltage signal is represented in FIG. 5 as the signal COMP_REF, i.e., compare reference, 566.

"Phase change" memory devices use fuses for redundancy and adjusting of reference voltages, reference currents, and timing. As one skilled in the art will appreciate from the sensing circuit 554 shown in FIG. 5, the voltage that is being compared, i.e., COMP_REF, against the voltage across the "phase change" memory cell is itself a reference voltage. Both reference voltages are generally programmed to a certain value with fuses. However, if the fuse used to adjust these reference voltages is also a "phase change" memory cell, a circular situation occurs. That is, the fuses contain information for the reference voltages, but the fuses use the reference voltages in order to be read properly.

The circular situation described above can be avoided where a self-biased first stage sense amplifier and a differential fuse strategy according to one or more embodiments of the present disclosure is utilized. Usage of a self-biased sense amplifier can eliminate the need for a reference voltage to clamp the maximum voltage, where the maximum voltage allowed across a fuse is the threshold voltage of a thin NMOS, e.g., Vt.

According to one embodiment of the present disclosure, a pair of fuses is configured in a differential manner in place of a single fuse, which eliminates the need for a reference voltage with which to compare the voltage across the fuse. The resistance state of the memory cell being used as a fuse is compared against the resistance state of a memory cell that has been programmed in a complementary fashion, thus avoiding the need for an external reference voltage in determining the resistance state of the fuse, and the circular situation described previously.

Figure 6:
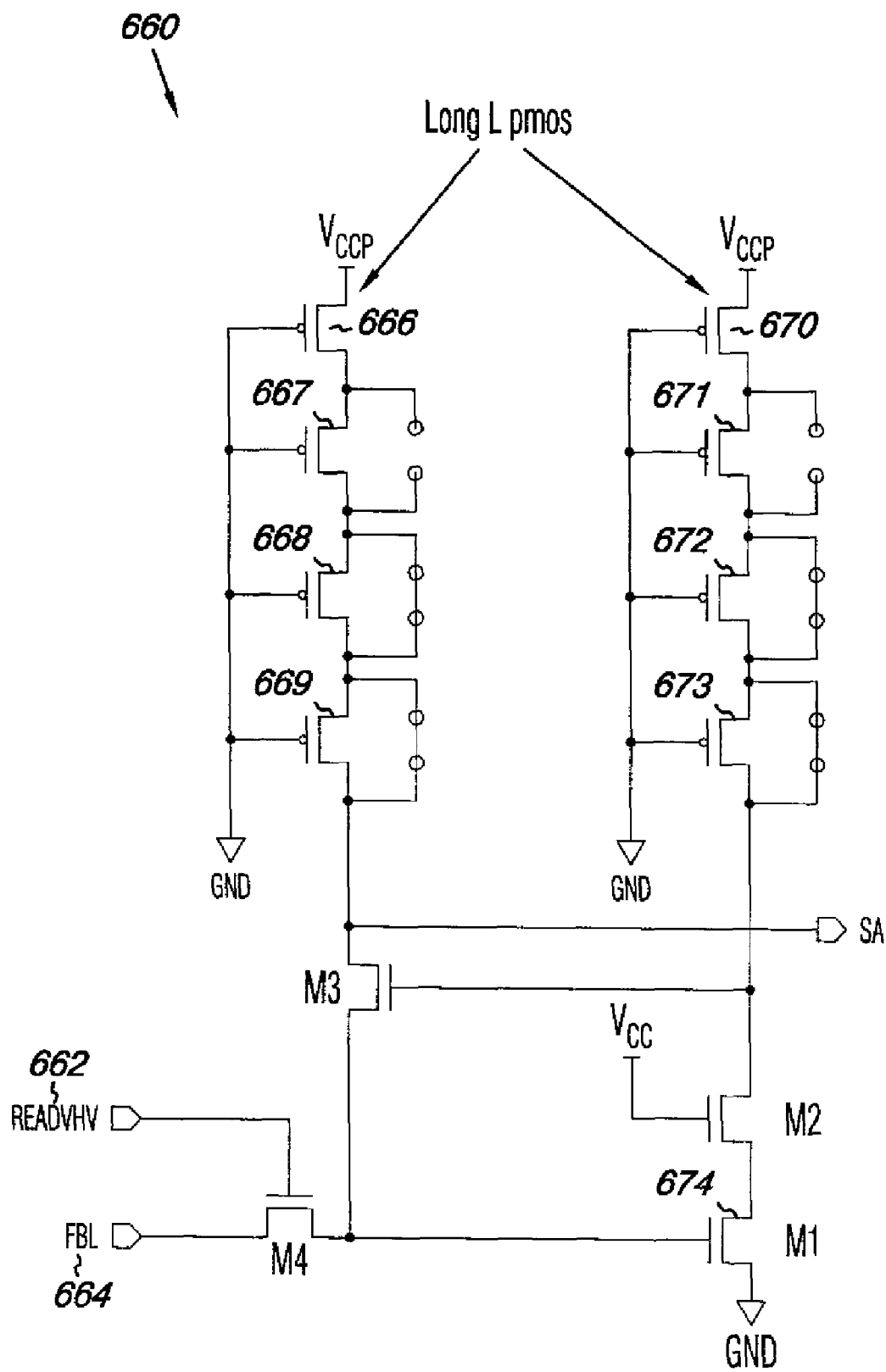
FIG. 6 illustrates a schematic of a self-biased sensing circuit in accordance with one or more embodiments of the present disclosure.

FIG. 6 illustrates a schematic of a self-biased sensing circuit in accordance with one or more embodiments of the present disclosure. The self-biased sensing amplifier 660 shown in FIG. 6 may be used as a $1^{st}$ stage, of a fuse sense amplifier in accordance with one or more embodiments of the present disclosure, as will be discussed further with respect to FIG. 8. The maximum voltage across the memory cell should be limited during a read of the memory cell, such as in order to avoid corrupting the phase of the "phase change" material, and thus the digital data represented thereby.

The embodiment of a self-biased sensing amplifier 660 shown in FIG. 6 includes a number, e.g., four, of short channel PMOS field effect transistors (FET), e.g., 666, 667, 668, and 669, together for a long channel ("Long L") PMOS FET. The long channel PMOS FET is coupled in series between Vccp, e.g., a pumped voltage source, and the self-biased sensing amplifier 660, e.g., "SA." The gates of the PMOS FETs are each tied to a ground reference potential, e.g., GND. Programmable links are arranged to short across the terminals of a number of the PMOS FETs so that the number of transistors effectively coupled in series can be programmed.

The drain of PMOS FET 669 is tied to the drain of an NMOS FET, e.g., M3, with the source of transistor M3 tied to the drain of another NMOS FET, e.g., M4. The gate of transistor M4 is driven by a signal READVHV 662. The source of FET M4 is connected to the memory cell sense line 664.

Two additional NMOS FETs are coupled in series, the drain of the first, e.g., M1, tied to the source of the second, M2. The source of M1 is coupled to ground potential, and the gate of FET M1 is coupled to the source of FET M3. Another programmable series of short channel PMOS FETs, e.g., 670, 671, 672, 673, is arranged as described previously for FETs 666, 667, 668, and 669, between Vccp and the drain of FET M2. The gate of FET M2 is tied to Vcc. The gate of FET M3 is tied to the drain of FET M2.

According to one or more embodiments of the present disclosure, e.g., as shown in FIG. 6, the following conditions exist during a read operation. Signal READVHV 662 is driven to Vccp. The fuse bit line sense signal 664, FBL, is coupled to the "phase change" memory cell (being used as a fuse) through the selected access device corresponding to the particular memory cell of interest. The PMOS devices, e.g., 666, 667, 668, 669, 670, 671, 672, 673, are short channel devices (connected in series to form a long channel device) used to supply a current, e.g., a bias current, to the memory cell to produce a bias voltage. M1 is a biasing transistor. The Vt of transistor M1 determines the bias level, e.g., the bias voltage, on the sense line 664, e.g., FBL.

If the voltage on the sense line 664, e.g., FBL, is near or above the Vt of transistor M1, the gate of M3 is pulled down and no pull-up current is applied to the fuse (through sense line 664). Hence, the voltage of the sense line 664 on the fuse will be approximately the Vt of M1, e.g., a NMOS Vt (~0.35 V). The voltage of the sense line 664 can swing slightly above or below Vt, depending on the resistance of the "phase change" material of the memory cell, e.g., +/−<100 mV, and typically +/−10 to 20 mV. If the sense line 664, e.g., FBL, voltage is below the Vt of M1, then the gate of M3 is pulled up, and a pull-up current is applied to the fuse being read, which is coupled to sense line 664, e.g., FBL, to interrogate, i.e., determine, the resistance of the "phase change" material of the memory cell. If the sense line 664, e.g., FBL, voltage rises above the Vt, then the current applied to the fuse being read is reduced through M3 via changes caused in the gate voltage, thus driving the voltage back down towards Vt. In this manner the bias voltage across the memory cell is limited to approximately the threshold voltage (Vt) of the bias transistor, e.g., M1. According to the above-described method for limiting the bias voltage across the memory cell, the bias current supplied to the memory cell is used as negative feedback to the bias transistor in order to maintain the bias transistor's junction voltage across the memory cell. The bias transistor can be configured such that the junction voltage of the bias transistor is within a read voltage region of the memory cell, thereby maintaining the voltage across the memory cell within a read voltage region of the memory cell.

The exact value of the pull-up current is not extremely important, as variance in the current only changes the common mode of the differential sense line 664, e.g., FBL, signals, and only has a second order effect on the maximum voltage allowed. FET M2 is arranged as a protection device that shields the thin oxide FET M1 from being presented a high voltage as a result of the current supplied from the series of short channel PMOS devices, e.g., 670, 671, 672, and 673. FET M4 is also arranged as a protection device that shields the thin oxide FET M1 from having a high voltage presented during a write operation.

According to one example computer simulation modeling the circuit shown in FIG. 6, with a break point in the programmable resistance of about 40 K-ohms, the bias current is approximately steady at about 8 micro chips below the resistance break point, decreasing for resistance values above approximately 40 K-ohms. The output (voltage) signal from the first stage sense amplifier is flat below the 40 K-ohm break point, also rising rapidly for larger programmed resistances. The bias voltage is clamped at approximately 0.35 V.

Figure 7:
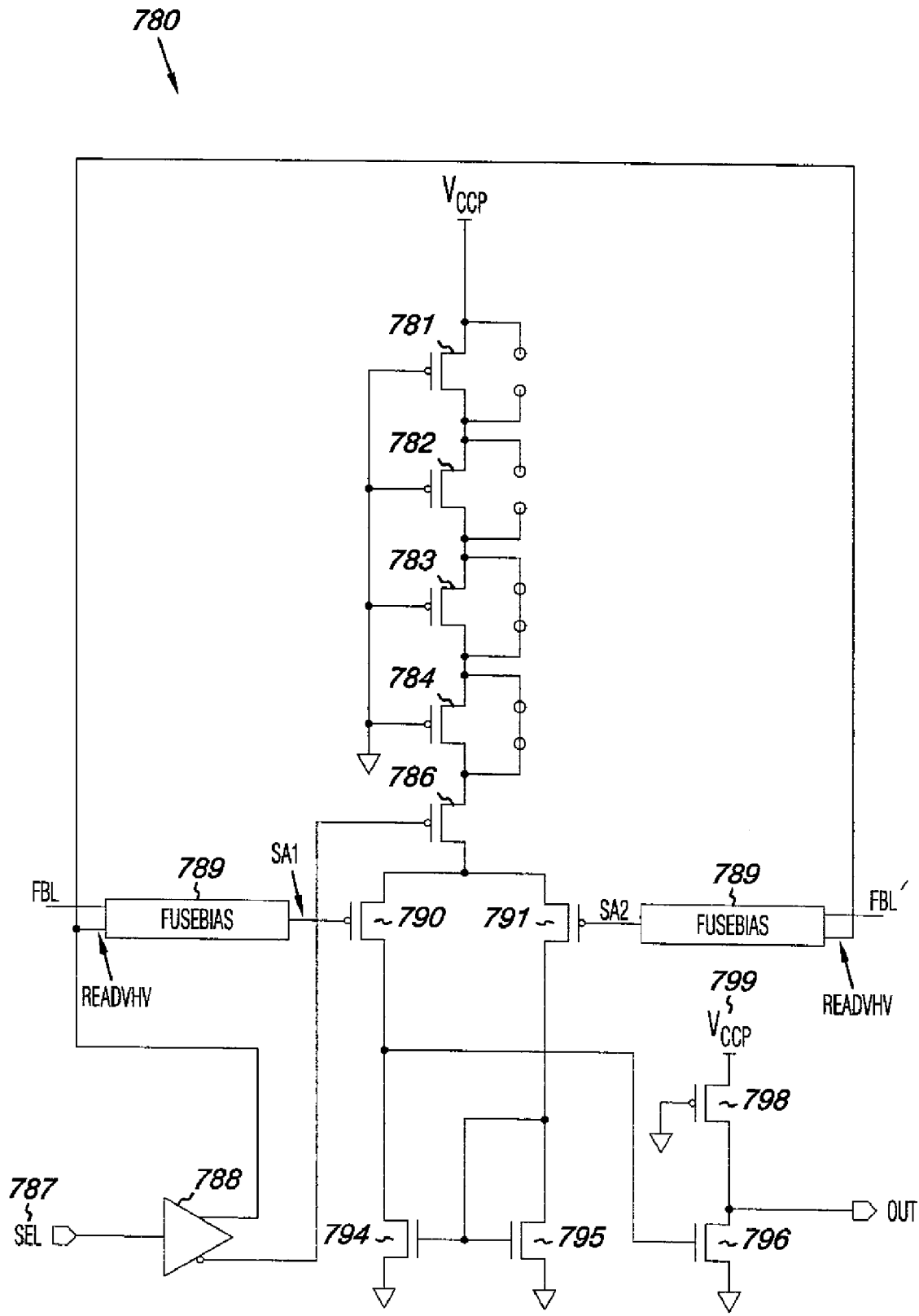
FIG. 7 illustrates a schematic of a $1^{st}$ and $2^{nd}$ stage of a fuse sense circuit, in accordance with one or more embodiments of the present disclosure.

FIG. 7 illustrates a schematic of a $1^{st}$ and $2^{nd}$ stage of a fuse sense circuit in accordance with one or more embodiments of the present disclosure. Two self-biased sense amplifiers 789, such as the one illustrated in FIG. 6, are shown in simplified form on the schematic as boxes labeled "fusebias." The embodiment of a fuse sense amplifier 780 shown in FIG. 7 includes a number, e.g., four, of PMOS field effect transistors, e.g., 781, 782, 783, and 784, coupled in series, source-to-drain, as a programmable current source between Vccp and the source of a first control PMOS FET 786.

Buffer 788 is a level shifter, accepting inputs at Vcc voltage source levels, and producing outputs shifted up in voltage to Vccp pumped voltage source levels. According to one or more example embodiments of the present disclosure, selection signal 787 is a Vcc based signal, e.g., not pumped, which is received at buffer 788. One output of buffer 788 is the READVHV signal communicated to each of the self-biased sense amplifiers 789, and an inverted output driving the gate of first control PMOS FET 786. Thus the select signal enables each of the first and second stages of the sense amplifier circuit 780 by making transistor M4 conducting (see FIG. 6) and first control PMOS FET 786 conducting.

The gates of the PMOS FETs, e.g., 781, 782, 783 and 783, are each tied to a ground reference potential, e.g., GND, so that they conduct and operate as a current source. However, programmable links are arranged to short across the terminals of a number of the PMOS FETs, e.g., 781, 782, 783 and 783, so that the quantity of transistors effectively coupled in series can be programmed into or out of the current source circuit.

In addition to the READVHV signal, the self-biased sense amplifiers 789 are coupled to the memory cells bra fuse bit line (FBL) signal line, e.g., FBL and FBL'. According to one or more embodiments of the present disclosure, memory cells used as fuses, or storing information critical to the operation of the memory (such as the programming of a reference signal) may employ complimentary memory elements, for example to ensure a higher level of data integrity.

According to one or more embodiments, a pair of complementary PCRAM memory cells comprising first and second programmable conductor memory elements are employed, each connected to respective access transistors. During a write operation, the first and second memory elements are written with complementary binary values, that is: if the first memory element is written to a high resistance state, then the second memory element is written to a low resistance state; whereas if the first memory element is written to a low resistance state, the second memory element is written to a higher resistance state.

Thus, during a read operation, both the first and second programmable conductor memory elements need to be evaluated. Thus signal line FBL is used to couple the first self-biased sense amplifier 789 to the first programmable conductor memory element, and signal line FBL' is used to couple the second self-biased sense amplifier 789 to the second programmable conductor memory element containing the complement information.

Outputs from each of the respective first and second self-biased sense amplifiers 789, e.g., SA1 and SA2, are connected to drive the gates of second control PMOS FETs 790 and 791 respectively. The drain of PMOS FET 790 is coupled to the drain of a first NMOS FET 794. The source of first NMOS FET 794 is coupled to ground. The drain of PMOS FET 791 is coupled to the drain of a second NMOS FET 795. The source of second NMOS FET 795 is coupled to ground. The gates of the NMOS FETs, e.g., 794 and 795, are connected, and coupled to the drain of second control PMOS FET 791.

The gate of a third NMOS FETs 796 is coupled to the drain of second control PMOS FET 790, with its source connected to ground and its drain connected to the drain of PMOS FET 798. The source of PMOS FET 798 is coupled to Vccp, and the gate of PMOS FET 798 is grounded. The output of the fuse sense amplifier 780, e.g., OUT, is derived from the drain of third NMOS FETs 796.

Because each bit of information is stored using complementary bit storage, two memory cells are interrogated together. Thus, the output of one of the first and second self-biased sense amplifiers 789, e.g., SA1 and SA2, will be "high" and the other will be "low." So, current from the current source, e.g., PMOS field effect transistors 781, 782, 783, and 784, will be sunk through one or the other of the second control PMOS FETs 790 or 791.

NMOS FETs 796 is made to conduct (driving OUT "low"), or not conduct (driving OUT "high"), depending on whether the sense amp signal SA1, from the first stage sense amplifier circuit drives PMOS FET 790 to conduct or which of course is determined from the resistance value stored in the memory cell, as discussed with respect to FIG. 6.

According to one example computer simulation for various common mode voltages generated by the complementary fuse arrangement shown in FIG. 7 indicated robust operation of the sensing circuit for a range of input voltage generated by the fuse.

Figure 8A:
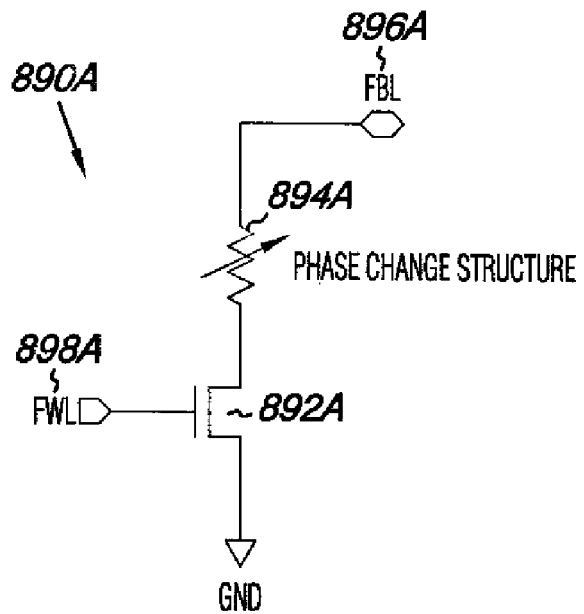
FIG. 8A illustrates a schematic of a memory cell in a first configuration as a fuse with a "phase change" structure and an access transistor, in accordance with one or more embodiments of the present disclosure.
Figure 8B:
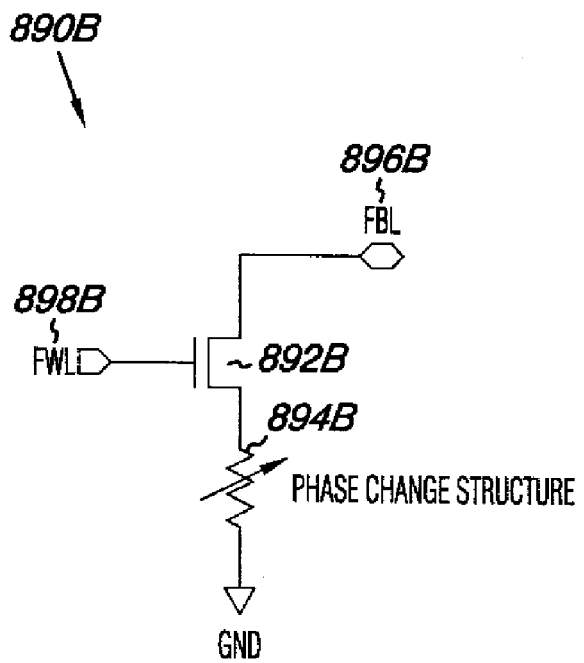
FIG. 8B illustrates a schematic of a memory cell in a second configuration as a fuse with a "phase change" structure and an access transistor, in accordance with one or more embodiments of the present disclosure.

FIGS. 8A and 8B illustrate schematics of a memory cell configured as a fuse with a "phase change" structure and an access transistor, in accordance with one or more embodiments of the present disclosure. FIGS. 8A and 8B each show a memory cell, e.g., 890A and 890B, is shown being configured for use as a fuse. An access transistor, e.g., 892A and 892B, is coupled in series with a "phase change" structure, e.g., 894A and 894B, having variable resistance corresponding with respective phase states of the "phase change" structure. For example, the "phase change" structure may be a programmable volume of chalcogenide, such as that shown in FIG. 1.

The memory cell 890A, shown in FIG. 8A, is arranged with one terminal of the "phase change" structure 894A coupled to the sensing line 896A, e.g., fuse bit line ("FBL"). The other terminal of the "phase change" structure 894A is connected to the source of the access transistor 892A. The drain of the access transistor 892A is coupled to ground as a sink for the interrogation current.

The memory cell 890B, shown in FIG. 8B, is arranged with the source of the access transistor 892B coupled to the sensing line 896B, e.g., FBL. The drain of the access transistor 892B is coupled to one terminal of the "phase change" structure 894B, with the other terminal of the "phase change" structure 894B grounded as a sink for the interrogation current.

The access transistor for each respective memory cell, e.g., 892A and 892B, is controlled with a fuse word line ("FWL") signal, e.g., 898A and 898B, to allow individual decoding for the fuse. The usage of a decoding signal, e.g., 898A and 898B allows for a large number of fuses to be sensed with a single set of biasing circuits, as shown in FIG. 7. Fuses are read in a sequential fashion, for example through the use of an oscillator, a counter, and a state machine. The results of reading each fuse can be stored in a set of latches, as is well known (not shown).

The usage of a self-biased sense amp allows for safe sensing without the help of external reference voltages. The usage of a differential fuse pair instead of a single ended fuse greatly simplifies sensing and provides dramatically larger sensing margin. Each fuse pair has a fuse that is in the amorphous state being compared to a fuse in the crystalline state, giving a factor of at least 10 between the different resistance and a large differential signal to sense.

CONCLUSION

The present disclosure includes methods, and circuits, for operating a programmable resistance memory device. One method embodiment includes storing a binary value as a resistance state in a first memory cell and as a complementary resistance state in a second memory cell. The method further includes determining the resistance state of the first memory cell using a first self-biased sensing amplifier and the complementary resistance state of the second memory cell using a second self-biased sensing amplifier, and comparing in a differential manner an indication of the resistance state of the first memory cell to a reference indication of the complementary resistance state of the second memory cell to determine the binary value.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for reading a programmable memory cell, comprising:
   supplying a bias current to the programmable memory cell to produce a bias voltage;
   limiting the bias voltage across the programmable memory cell to approximately a threshold voltage (Vt) of a bias transistor;
   using the bias current supplied to the programmable memory cell as negative feedback to the bias transistor to maintain a junction voltage of the bias transistor; and
   wherein the junction voltage of the bias transistor is within a read voltage region of the programmable memory cell.

2. The method of claim 1, wherein the bias current is supplied to a programmable volume of the programmable memory cell, and wherein the programmable volume has more than one resistance state.

3. The method of claim 2, wherein the read voltage region includes voltages less than those associated with re-programming the resistance state of the programmable volume.

4. The method of claim 1, wherein the bias voltage is limited the threshold voltage (Vt) of the bias transistor plus or minus 10 mV.

5. The method of claim 4, wherein the bias transistor is a NMOS field effect transistor.

6. The method of claim 1, wherein using the bias current supplied to the programmable memory cell as negative feedback to the bias transistor includes applying the bias voltage to the gate of the bias transistor, bias voltage of at least Vt causing the bias transistor to turn on, the bias transistor being configured to reduce the bias current when turned-on so as to decrease the bias current and bias voltage.

7. The method of claim 6, wherein applying the bias voltage to the gate of the bias transistor includes applying the bias voltage through a select transistor to the gate of the bias transistor.

8. The method of claim 7, wherein the method includes passing the bias current through the select transistor.

9. The method of claim 1, wherein using the bias current supplied to the programmable memory cell as negative feedback to the bias transistor includes applying the bias voltage to the gate of the bias transistor, bias voltage of less than Vt causing the bias transistor to turn off, the bias transistor being configured to increase the bias current when turned off so as to increase the bias current and bias voltage.

10. The method of claim 1, wherein the method includes:
    applying a positive voltage to a gate of a transistor through which the bias current flows when the bias transistor is turned off; and
    applying a reference voltage to the gate of the transistor through which the bias current flows when the bias transistor is turned on.

11. The method of claim 10, wherein the transistor through which the bias current flows is a NMOS field effect transistor.

12. The method of claim 1, wherein the method includes:
    turning on a transistor through which the bias current flows when the bias transistor is turned off; and
    turning off a transistor through which the bias current flows when the bias transistor is turned on.

13. The method of claim 1, wherein the method includes maintaining the bias voltage slightly above or below the Vt of the bias transistor based on the resistance of the programmable memory cell.

14. A method for reading a programmable memory cell, comprising:
    supplying a bias current to the programmable memory cell to produce a bias voltage;
    applying the bias voltage across a gate-source of a bias transistor;
    pulling a gate voltage of a transistor through which the bias current flows to a ground potential as the bias transistor turns on thereby decreasing the bias current and the bias voltage; and
    pulling the gate voltage of the transistor through which the bias current flows to a source potential as the bias transistor turns off thereby increasing the bias current and the bias voltage.

15. The method of claim 14, wherein the bias voltage is limited the threshold voltage (Vt) of the bias transistor plus or minus 10 mV, the Vt of the bias transistor plus or minus 10 mV being within the read voltage range of the programmable memory cell.

16. The method of claim 14, wherein the bias transistor and the transistor through which the bias current flows are each a NMOS field effect transistor.

17. A method for reading a programmable memory cell, comprising:
    supplying a bias current to the programmable memory cell to produce a bias voltage;
    decreasing the bias current and the bias voltage in response to the bias voltage being at least a threshold voltage (Vt) of a bias transistor; and
    increasing the bias current and the bias voltage in response to the bias voltage being less than the Vt of the bias transistor.

18. The method of claim 17, wherein the method includes applying the bias voltage to a gate of the bias transistor; and wherein the bias current does not pass through the bias transistor.

19. The method of claim 17, wherein decreasing the bias current includes changing a channel resistance of a transistor through which the bias current flows based on the state of the bias transistor.

* * * * *